US007207413B2

(12) United States Patent
Plummer

(10) Patent No.: US 7,207,413 B2
(45) Date of Patent: Apr. 24, 2007

(54) CLOSED LOOP EMBEDDED AUDIO TRANSMISSION LINE TECHNOLOGY FOR LOUDSPEAKER ENCLOSURES AND SYSTEMS

(75) Inventor: Jan Princeton Plummer, Marietta, GA (US)

(73) Assignee: TBI Audio Systems LLC, Marietta, GA (US)

( * ) Notice: Subject to any disclaimer, the term of this patent is extended or adjusted under 35 U.S.C. 154(b) by 311 days.

(21) Appl. No.: 10/709,538

(22) Filed: May 12, 2004

(65) Prior Publication Data

US 2004/0251079 A1 Dec. 16, 2004

Related U.S. Application Data

(63) Continuation-in-part of application No. 10/250,078, filed on Jun. 2, 2003.

(51) Int. Cl.
*H05K 5/00* (2006.01)
*H04R 1/02* (2006.01)
*H04R 1/28* (2006.01)
*H04R 1/38* (2006.01)

(52) U.S. Cl. ...................... 181/199; 181/148; 181/151; 181/155; 181/145; 381/337; 381/345; 381/351; 381/352

(58) Field of Classification Search ................ 181/148, 181/151, 155, 145, 199, 146; 381/345, 351, 381/352, 160, 337, 338, 386, 395
See application file for complete search history.

(56) References Cited

U.S. PATENT DOCUMENTS 3,430,728 A * 3/1969 Dunning ..................... 381/348
4,161,995 A * 7/1979 Pohlmann et al. .......... 181/150
RE31,483 E * 1/1984 Hruby, Jr. ................... 181/151
4,509,615 A * 4/1985 Hruby ......................... 181/148
4,591,020 A * 5/1986 Hruby, Jr. ................... 181/145
5,452,362 A * 9/1995 Burward-Hoy ............ 381/71.5
6,013,362 A * 1/2000 Takahashi et al. ....... 428/304.4
6,094,495 A * 7/2000 Rocha ........................ 381/340
6,144,751 A * 11/2000 Velandia ..................... 381/345
6,169,811 B1 * 1/2001 Croft, III .................... 381/186
6,389,146 B1 * 5/2002 Croft, III .................... 381/345
6,411,720 B1 * 6/2002 Pritchard .................... 381/348
2002/0076069 A1 * 6/2002 Norris et al. ............... 381/191
2003/0095672 A1 * 5/2003 Hobelsberger ............... 381/96

* cited by examiner

*Primary Examiner*—Lincoln Donovan
*Assistant Examiner*—Jeremy Luks
(74) *Attorney, Agent, or Firm*—McNeely IP Law; Kevin J. McNeely

(57) ABSTRACT

An acoustic impedance matching enclosure is provided having a driver loaded into a chamber buffering the throat/mouth of a closed loop transmission line. Transmission line consists of a termination member, outer and inner enclosure walls, high-density lining and throat/mouth area. Transmission line eliminates internal random standing waves while providing variable-frequency standing waves that through superposition of the waves compensates for mass-acceleration loss of the high-end of the driver output while damping the resonance of the driver. Alternative application of the acoustic impedance matching enclosure is that of compression loading the driver directly into the closed loop transmission line and using an acoustic low pass filter to translate the output into low frequencies only through a port. Both applications of the acoustic impedance matching enclosure are to insure that the drivers' diaphragm is clear of disruptive internal standing waves, properly loaded at all frequencies and not easily affected by room reflections.

18 Claims, 18 Drawing Sheets

A

B

A

B

A

B

CLOSED LOOP EMBEDDED AUDIO TRANSMISSION LINE TECHNOLOGY FOR LOUDSPEAKER ENCLOSURES AND SYSTEMS

BACKGROUND OF INVENTION

Loudspeakers are a part of everyday life and used for consumer, commercial, military and research applications. The typical loudspeaker is an electro-dynamic transducer and has a diaphragm of some depth and diameter or shape. Electro-dynamic describes a transducer that moves in a positive and negative direction in response to a alternating voltage source to stimulate adjacent air molecules. At this point in time loudspeakers of this type are considered a commodity and are cheap and plentiful in supply. They are typically always mounted on a baffle as part of an existing product or structure; in some form of housing for practical containment or in some cases a form of specialized enclosure is utilized to enhance the bass performance. There are other types of electro-mechanical transducers in use generally exotic but most of which will benefit from the use of the Embedded Transmission Line Technology.

One of the greatest problems is the inherent nature of the driver to favor an acoustic impedance over a narrow range of frequencies relative to its' size. The smaller driver generally has unfavorable acoustical impedance for lower frequencies and vise versa for larger ones. The enclosure also favors a narrow range of frequencies and for others it reacts violently creating a plethora of incoherent internal standing waves that modulate the diaphragm with nonsymmetrical vibration patterns. These random internal modulations disturb the natural dispersion pattern of the driver and cause electrical feedback (reactance) to the amplifying source. Brute force power and heavy gauge wiring are current attempts to minimize this problem for the amplifier and the effects on sound quality. Another problem is the general acoustic impedance differential that exists on either side of the driver diaphragm. The diaphragm must work simultaneously in two different acoustic environments as the enclosure creates standing waves that constantly modify the drivers' acoustic impedance in most of its' frequency range. Reflected waves from the room cause additional modifications of the drivers' acoustic impedance more as the frequencies go lower towards that of the rooms' dimensions. Smaller enclosures are much worse because of the even higher frequencies that are reflected internally and the lack of low frequency capabilities. Two identical drivers will sound different due to their operating enclosure only. The industry has recognized the problem as one associated more with the mid-range speaker and has produced units with a solid basket behind the diaphragm. This may prevent random standing waves from the other drivers but it creates extreme backpressure for the range of frequencies produced by the midrange driver. This causes the driver to see a distinct acoustic impedance differential for all of its' operating range and not produce a natural sound.

Loudspeaker driver dimensions favor a certain range of frequencies thus making a single size for all frequencies an impossible task if wide axis listening is desired. It is a design goal to produce loudspeakers of the smallest dimensions necessary and maintain the proper loudness level while retaining the sonic presentation of full frequency range, low distortion, wide-constant dispersion and low cost. If one were to examine the situation it would appear to be a paradox requiring a compromise solution and the use of multiple drivers operating for a common acoustic purpose.

This is reflected in the current loudspeaker design with theory compromised by art in an effort to produce subjectively accepted loudspeakers when the goal should be objectivity.

The requirement to use a single driver places a compromise solution favoring the lower or higher end frequencies while attempting to maintain quality in the middle ranges. The human ear tends to more sensitive to the higher frequencies but the human ear-brain combination prefers to hear all of the frequencies in the spectrum without phase or frequency aberrations to interrupt the flow of energy of the event otherwise it will appear to be artificial. The reproduction of sound is typically for either of two purposes and that is communication and entertainment. The latter requires unencumbered sonic balance and dispersion to balance the energy in the listening environment.

The continued efforts to perfect sound reproduction with predictable field results depend greatly on a solution to solve the dilemma of the enclosure. Engineers recognize the drivers' enclosure as a necessary evil or an opportunity to profit from the furniture created however the use of the enclosure as explained in the pending application provides a positive operating environment exposing the true quality of the driver. The result is elimination of the idiosyncratic behavior, objective sonic acceptance, simplified loudspeaker design and predictable results for varying acoustic situations.

SUMMARY OF INVENTION

This application relates to the reproduction of the full range of audio frequencies using a specific technique that allows for the delay of sound waves in a very short distance within a defined space to create beneficial standing waves over a wide frequency range. Its relation to an earlier application is that of a radial expansive transmission line created when a sound wave traverses a path of a different dynamic acoustic density. The pending application was directed to sub-bass frequencies and included direct radiation of upper bass frequencies but suggested an open line. There was no suggestion for use with full range speakers. It has been determined that an open line although somewhat beneficial would only allow for limited and ambiguous sound output. Although the earlier application defined the transmission line as radial the invention described within introduces the embedded line whose function is consistent with a shorted termination transmission line radial or otherwise and not required to be symmetrical in its' relation to the driver to perform its' function. Radial implementation of this device defines symmetry and is considered the most logical path if possible. This type of line is defined as a Closed Loop Embedded Acoustic Transmission Line (EATL) and does not provide an exit path into the ambient for the wave. Dynamically the internal enclosure volume varies due to the EATL construction acting with a constant pressure relative to frequency.

Normally a transmission line is used to carry energy in one direction from an originating point to a consumption or load point. An audio transmission line must provide a distinct path for a wave of energy that results in the complete wave being present at some physically distant point. Any panels spaced sufficiently apart will cease to be a waveguide and not contain the wave. The panel spacing would in actuality depend on the volume of air involved with the wave energy. Within the loudspeaker industry an acoustic transmission line will convey acoustic energy away from the rear of the driver to the terminus in an attempt to prevent the back wave energy from reflecting back on the driver and not to interfere with the radiated output of the driver. The terminus is the terminology used to described the wave energy exit and can be at the front, rear or bottom of the typically large TL enclosure. Large dimensions are required for existing TL designs to have any effect on other than midrange frequencies. The goals of today's audio industry is for things to work better and be smaller unless for commercial applications when better can be almost any size. The rather larger dimensions typically required don't providing loading of the driver to sub-bass frequencies. It is argued in some enthusiasts circles that a transmission line for loudspeakers have infinitely dissipative loading and not assisting the main driver in any way to add or subtract from the output at the diaphragm. The EATL is proving a more effective implementation of the transmission line with more achievable and definitive goals for a speaker designer for the full range of loudspeaker applications.

The proposed invention relates to loudspeakers and in particular methods of improving the quality of reproduction for very low, low, middle and higher frequencies, reducing the relative enclosure dimensions, reducing the costs and dependency on the rooms' acoustics for consistent results. The improvements reflect on a manner of enclosing the driver that frees it from dependence on its' general ambient acoustic environment and allows small drivers of essentially the same diameter to function as full range units or subwoofer units that operate with full range units primarily to extend the response into the lowest registers of the frequency spectrum. Although this applications' focus is on smaller speaker units this technique applies to large-scale bass, full range or sub-bass sound reproduction applications to enhance the larger drivers performance as well. Focus on operation in the sub-bass range generally involves using a port or horn to reduce the motion of the diaphragm near the maximum low frequency output range. Larger drivers will produce more low bass with less diaphragm motion but will be less favorable for direct radiating full range operation because of limited high frequency capabilities. Low frequencies can be directly radiated or radiated through a port or horn coupling for larger drivers. The EAL maintains a constant enclosure pressure over the full frequency range and any volume displacement that can't occupy the line results in greater displacement of the drivers' diaphragm. This results when long wavelength signals stimulate the EATL creating beneficial standing waves to load the driver diaphragm. All wavelengths exist at some finite length within the line as partial or complete as dictated by the variable dynamic air density. Any pressure stimuli will cause a dynamic molecular disturbance within the EATL that creates desirable standing waves that displace the diaphragm with greater ease and accuracy than the signal alone. This enhanced physical displacement is both created by and is the result of the drivers' stimulation by the electrical source plus the dynamic standing wave pattern established within the EATL. This predictable internal loading pattern takes precedent over all other external driver diaphragm stimuli providing critical damping, optimal loading and resistance to room reflections.

Furthermore this technology allows a small single driver type and dimension to be optimized for full range and sub-bass operation using small drivers normally efficient only in the higher frequency ranges. The enclosures developed using the pending application determine the acoustic impedance favored by the identical drivers.

DETAILED DESCRIPTION

Figure 1:
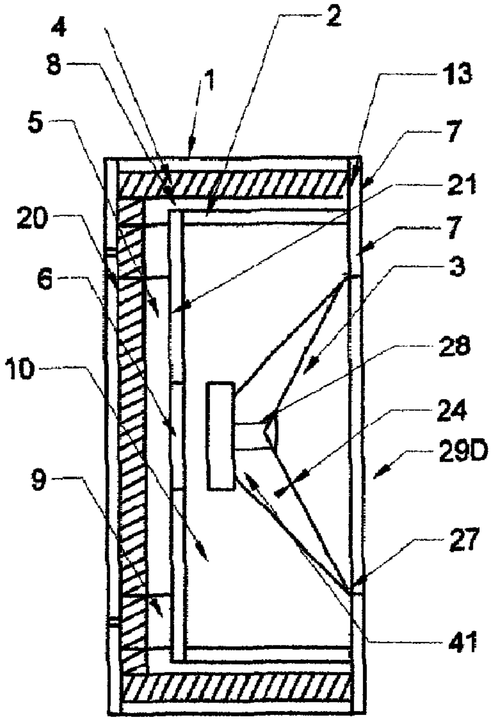
FIG. 1A and FIG. 1B is a side and front cross section view of a preferred embodiment of the Indirect Direct Coupled (IDC), Embedded Acoustic Transmission Line (EATL) in accordance with this invention.
Figure 1:
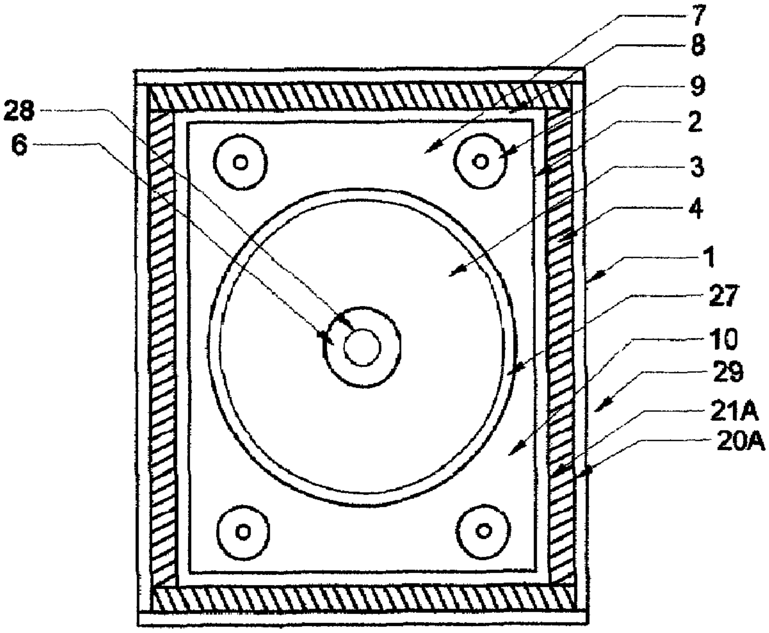

Throughout this document there will be references to particular items, figures, names, phrases and notable words. The items will appear written once with a bold Capital introductory letter and then abbreviated in the bold letters representing the name in text following. The capitalized bold first letter ('s) and abbreviation may appear subsequently to refresh the memory. Some important statements may be underscored for recognition purposes. Certain terms that may also have an importance in this document but are not pertaining directly to a feature of the document and will not be highlighted or underscored in this mode. FIG. 1 represents a preferred embodiment of the subject invention. FIG. 1A and FIG. 1B represent a complete Direct Radiator Enclosure (DRE) 29D speaker assembly constructed according to this invention. Bernoulli's theorem for the flow of liquid plainly states that a pressure differential must exist for a fluid to flow from a container through a discharge opening into a pressure region the same as that of the container. This simply means that if a sound (a fluid) of high quality is to be produced by a loudspeaker that a pressure differential must exists between its' diaphragm and the atmospheric pressure and it must be consistent for all frequencies and acoustic conditions. All drivers of concern with this invention are bi-directional meaning that they radiate sound from both sides of the diaphragm. One side of the Driver Diaphragm (DD) 3 must be dynamically isolated from the Atmospheric Pressure at all frequencies within its range without concern for reflections from within or external. Dynamic isolation refers to isolation from atmospheric pressure when in motion not static isolation.

FIG. 1A illustrates a side cross sectional view of the DRE 29 enclosure with the Indirect coupled (IDC) Embedded Acoustic Transmission Line (EATL 5) structured to receive air pressure through its' throat/mouth 6 behind the driver 41 mounted on baffle board 7 but buffered by the air chamber 10 of FIG. 1A. The EATL 5 unlike conventional transmission lines has its throat and mouth at the same point through superposition. IDC means that the wave that enters the EATL5 does so through an air chamber 10 of some relative volume so its' influence on the DD 3 will be indirect yet influential. The EATL5 is constructed of the wave-guide 20 of the outer cabinet 1 and the wave-guide 21 of the Inner enclosure 2 separated by spacers 9. The EATL5 can be extended by using the side cabinet walls wave-guide 21 that are inherent in construction of the inner box in conjunction with extensions of wave-guide 20. These extensions of the EATL5 are 20A and 21A and will allow the EATL5 to operate to a lower frequency than the 20 and 21 alone but are generally relative to driver 41 size. The EATL5 is sealed by the termination member 13 that contains the wave at one end of the EATL5 reverses it and creates Dynamic Standing Waves (DSW) at the throat/mouth 6 located in the center (from each corner) as seen in FIG. 1B. The term throat/mouth defining 6 results from the reflected wave having its point of exit at the same point as the waves point of entry. The fact that the in/out waves can be superimposed on each other accounts for this unique pressure feedback principle. The air volume within the EATL5 is always small relative to the operating volume of chamber 10 of FIG. 1 or 19 of FIG. 6 and is not to be confused with any type of closed band-pass box closed. The overall dimensions may be further reduced using miniature construction techniques to enhance the output of smaller drivers in small spaces as well as OEM tweeter construction where the rear wave will be collected and returned as beneficial standing waves. The spacing dimensions can be reduced or increased as needed and the EATL5 may be repeatedly folded to increase its' length as needed if 20A and 21A are not adequate in length.

The EATL5 is lined with an Alternate Density Transmission Medium (ADTM4), which in the preferred embodiment is open cell urethane foam that under normal air density and higher frequencies is inert, randomly accepting new air particles, yet at lower frequencies when pressurized allows additional air molecules to expand to within its' cell structure in search of volume but instead are lost in heat dissipation. This is a lossy process hence the DSW and damping of the Driver Resonance Peak (DRP) as shown in FIG. 10A vs. FIG. 10B whereas FIG. 10A is the curve of the preferred embodiment. Damping is a term referring to ability of a vibrating body to cease motion immediately when stimulus is removed.

Figure 2:
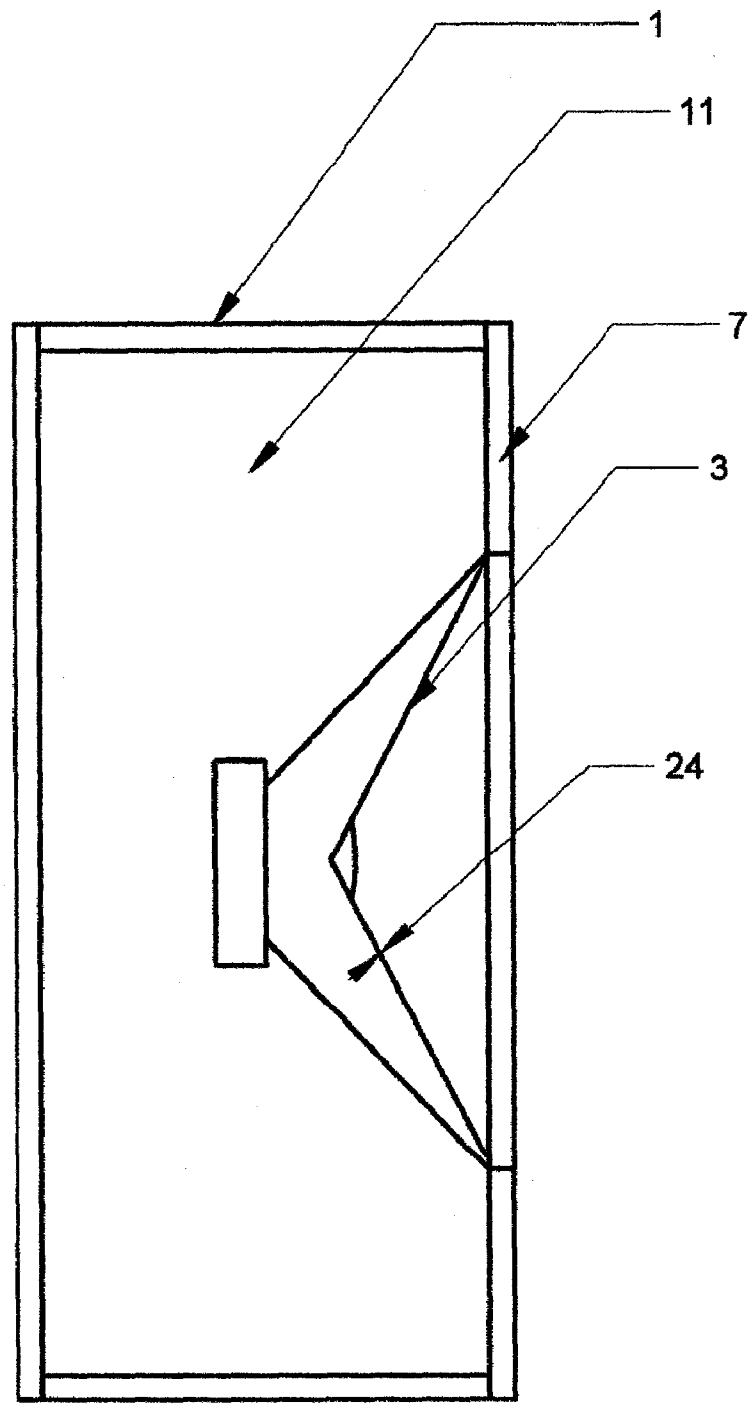
FIG. 2 is a cross section view of an enclosure of equal exterior dimensions and material as the enclosure of FIG. 1 without the EATL features included.

A relatively high frequency wave entering the throat/mouth 6 of the EATL5 has only to be within inches of the driver diaphragm 3 to reach its wavelength in normal air density. The standard enclosure in FIG. 2 example here is only a few inches deep meaning that any wave below 10 kHz would experience enclosure reflections almost immediately. FIG. 2 represents an enclosure of air volume 11 with identical dimensions as that of FIG. 1 but without 2 and 4 of that structure. The waves traveling the stream lines 15 will enter the mouth 6 of the EATL5 and travel through the EATL5 barely interacting with the surface cells of the ADTM4 expanding almost immediately until it reaches the termination point 13, which then reflects the wave back toward the driver diaphragm 3. The throat/mouth 6 at the entrance of the EATL5 will experience nodes and anti-nodes (DSW), which overlap and influence the pressure in chamber 10 behind the driver 41 and are considered a positive pressure relative to the atmosphere. As the frequencies go lower from that first influenced, the EATL5 will maintain a constant positive pressure on the driver diaphragm 3 due to the DSW condition of the air space 8 and the DSW condition caused by depth migration indicated by streamlines 14. As varying wavelengths/intensities occupy deeper depths of the ADTM4 cell structure they create individual DSW and therefore dynamically enhance motion of the driver diaphragm 3. The individual DSW produced will integrate their pressures and produce a composite DSW in the presence of multiple frequencies simultaneously (superposition). Wave-guides 20, 21 must remain within a close spacing so as to contain the wave energy while directing it to the termination member 13. [In the preferred example here 20, 20A, 21, 21A are at 12 mm and 9 mm spacing respectively and will vary somewhat depending on driver diameter and purpose for system.] The driver 41 will see these DSW influence its acoustic impedance because the pressure-differential with that of the atmosphere is maintained with frequency. The DSW are the result of changing frequencies, driver compliance and resistance by the ADTM4 material to the sound energy entering its' cells. The resulting interaction of the three variables maintains the chamber 10 pressure constant as the frequency changes while the drivers velocity remains linear. Internal pressure at chamber 10 would be a composite DSW resulting from the voice coil 28 signal input and the initial motion of the DD 3, the static pressure of 10 and the positive pressure created in the EATL5. This resultant composite pressure is constant and is relative to intensity and wavelength in the EATL5 and determines DD 3 motions.

Figure 12A:
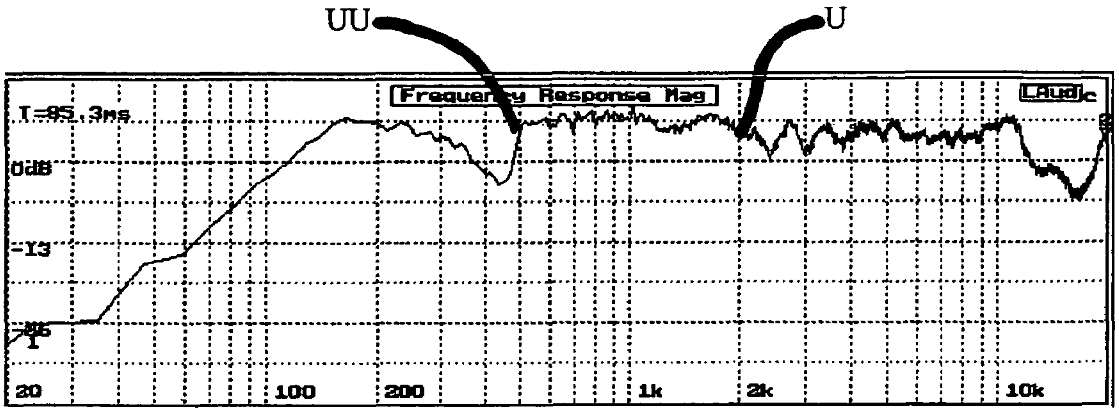
FIG. 12A, FIG. 12B, FIG. 12C, FIG. 12D are graphical representations of performance claimed in the specification and are indicated by reference designations matching in the text.
Figure 12B:
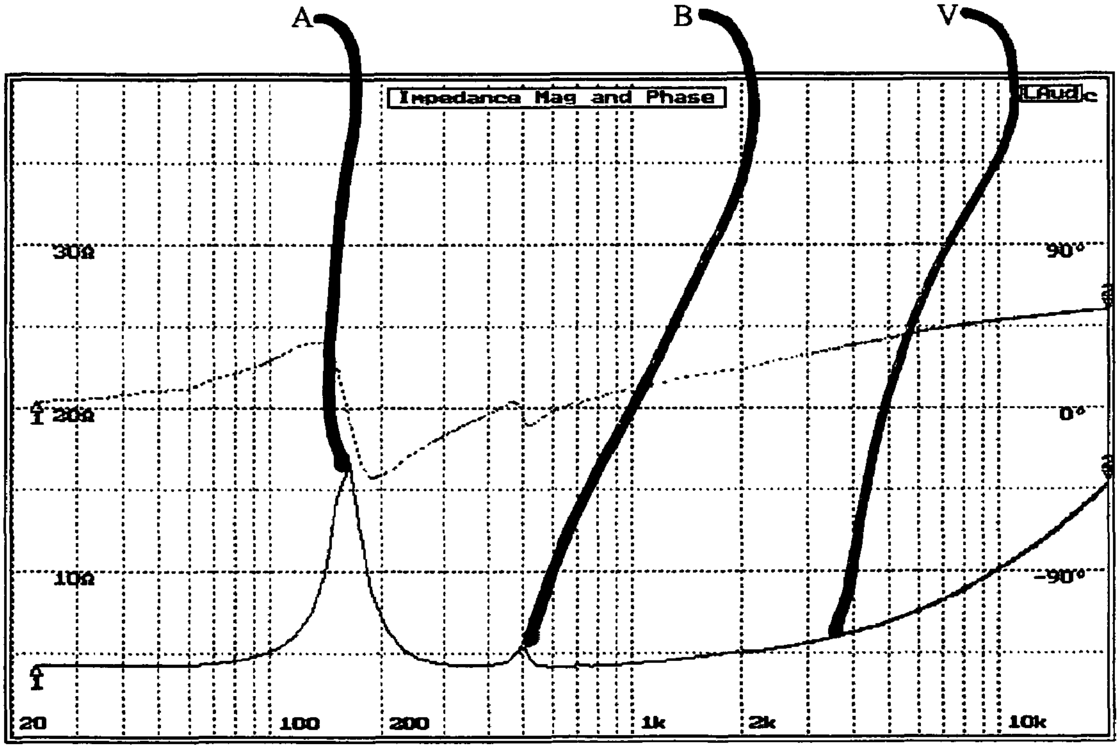
Figure 12C:
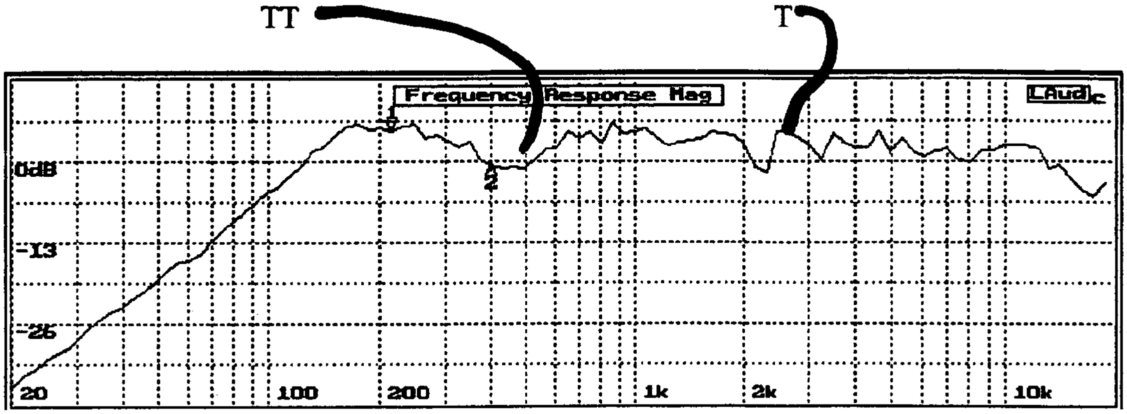
Figure 12D:
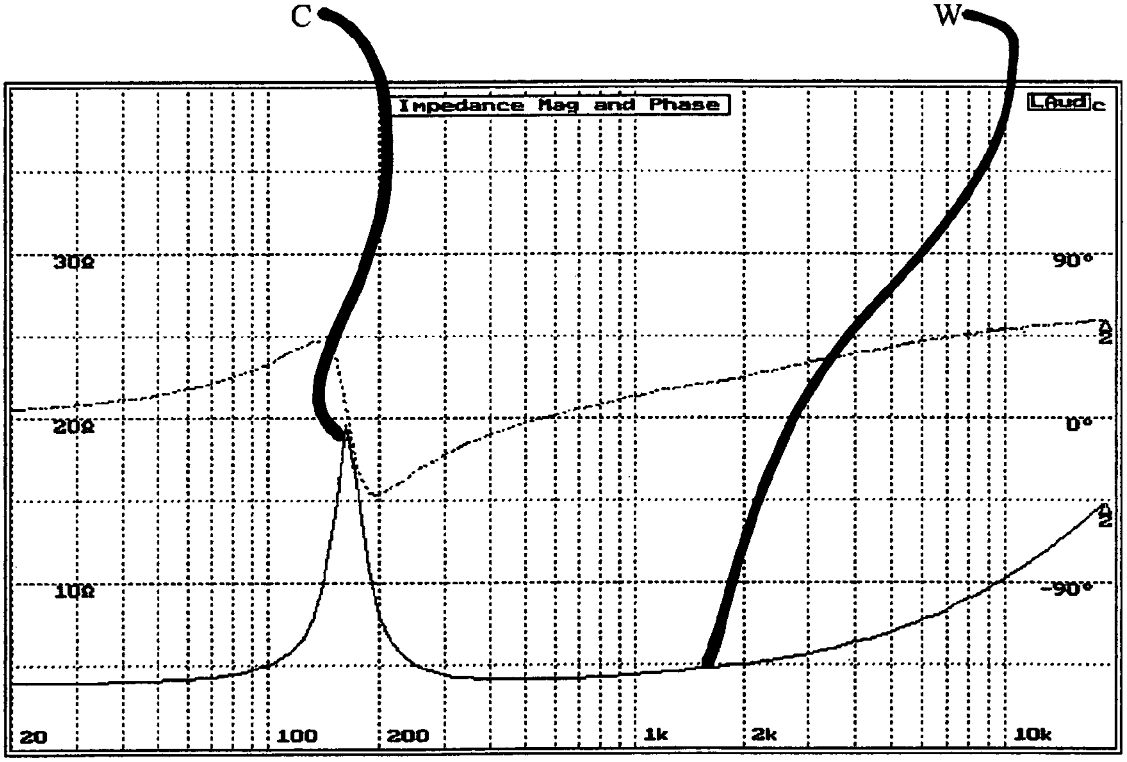
Figure 13A:
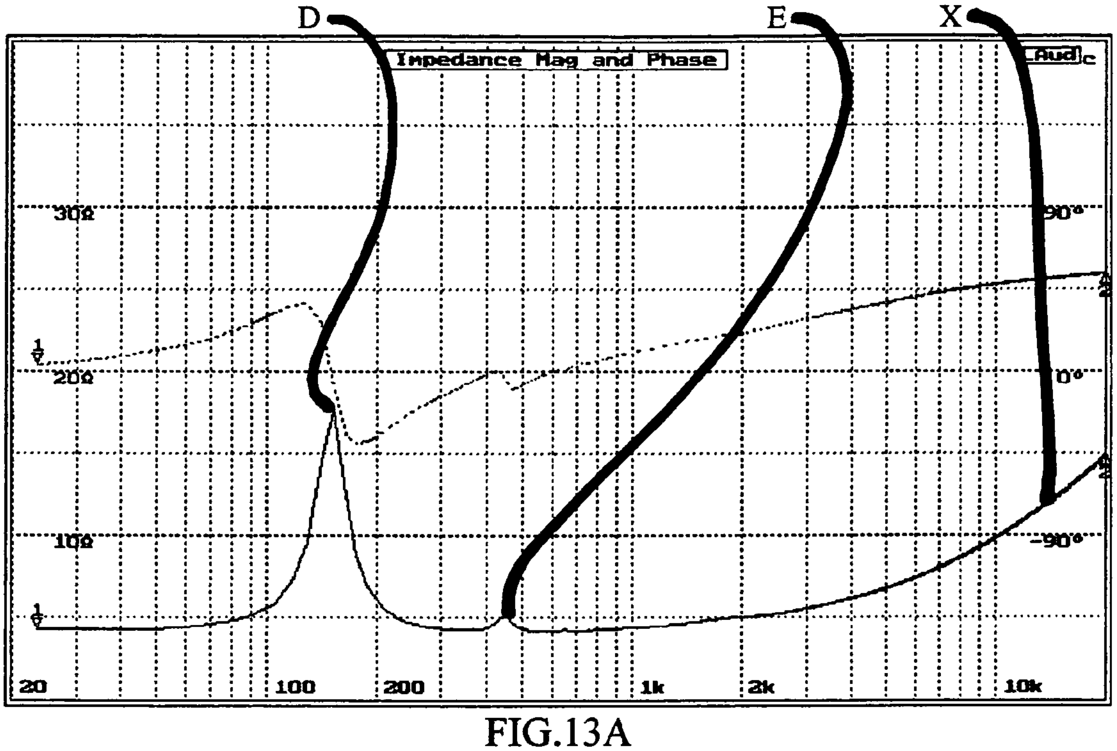
FIG. 13A, FIG. 13B, FIG. 13C, FIG. 13D are graphical representations of performance claimed in the specification and are indicated by reference designations matching in the text.

The length of the EATL5 is directly associated with its' low frequency limit of influence as is clearly indicated by the curves of FIGS. 12B and 13A. In FIG. 12B the impedance plot of the speaker system of FIG. 1 is indicated. There are two peaks associated with this impedance plot; the large one A is the DRP that occurs at 150 Hz and the other peak B that occurs at 500 Hz represents the EATL 5 ¼ wave impedance peak of FIG. 1. FIG. 13A represents the frequency response if the enclosure of FIG. 1 is lengthened by 2 cm to become the enclosure FIG. 3. The 2 cm increase in enclosure depth 26 FIG. 3 can be interpreted in FIG. 13A by the new EATL 5 peak E at 400 Hz to cause a 100 Hz shift downward in ¼ wave frequency at the EATL5 throat/mouth for processing into DSW. The main driver resonance frequency of FIG. 3 does not change appreciably when chamber 10 is increased as seen in 40 FIG. 13A. It can also be seen in the frequency response plot Q of FIG. 14E of FIG. 3 to show the lifting of output to begin at 400 Hz instead of the 500 Hz of the shallow enclosure of FIG. 1. A large peak C can be seen in FIG. 12D (which is the standard closed type enclosure FIG. 2 with the same driver) but without a properly damped (controlled) impedance peak A or an EATL 5 peak Bas FIG. 1 or FIG. 3. The change in volume 10 did little to affect the drivers' resonance frequency A of the driver 41, which indicates the effectiveness of the EATL5 in delaying the wave in such a short distance. The damping of the DD 3 improves acoustic impedance for bass frequencies lessening cut-off slope for deeper bass extension and better overall transient performance. The 500 Hz EATL5 peak B of FIG. 12B represents the lowest frequency that will be lifted by the EATL5 of FIG. 1 to correct the sagging output (FIG. 12A vs. 12C) of the DD3 that normally occurs above the driver resonance frequency A and the point in which the EATL5 will begin to dampen oscillatory conditions near, at and below the drivers' resonance frequency A FIG. 12B.

Figure 3:
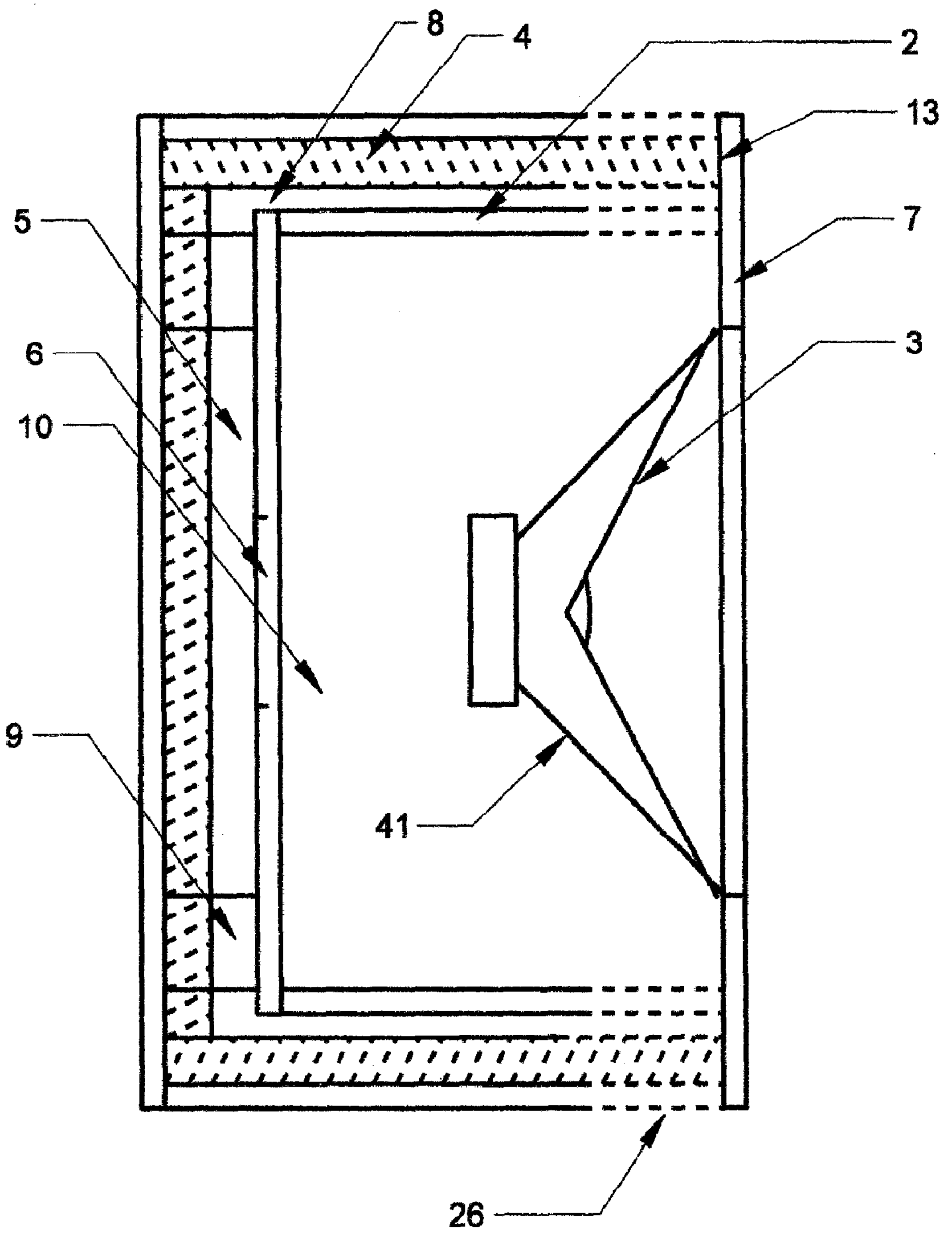
FIG. 3 is a cross section view of the IDCEATL side view of FIG. 1 in accordance with this invention with sides indicated to show an extended portion.
Figure 13B:
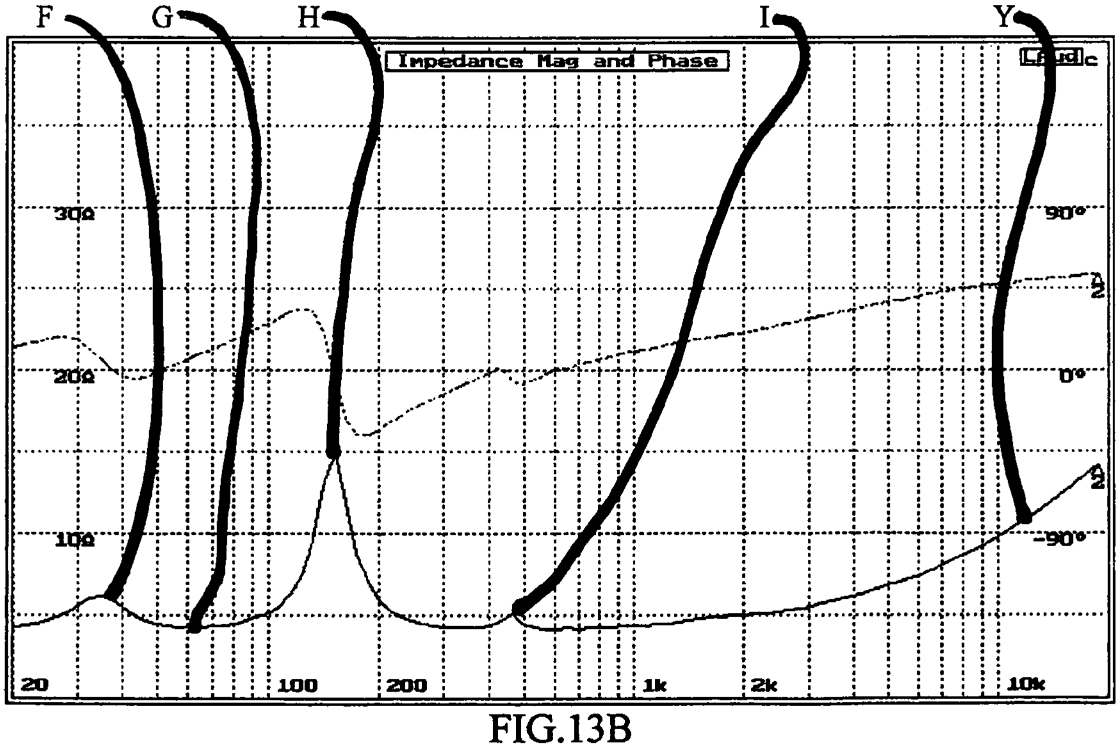

The impedance curve FIG. 12D of FIG. 2 shows the same location for the drivers' resonance frequency C as that of FIG. 12B of FIG. 1 and FIG. 13A of FIG. 3. The curve in FIG. 12D, clearly shows this peak C occurring at 150 Hz and if followed closely above this point shows no EATL5 peak B as in FIG. 12B, FIG. 13A and FIG. 13B. If the curve U of FIG. 12A of FIG. 1 is observed it will show an increase in output be-ginning at 500 Hz or the same point as the EATL5 peak B of FIG. 12B. All frequencies above this peak will show an increase in output developing a gain to increase and maintain a flat response. The gain in efficiency averages 6 db for this particular example when averaging several points from 500 Hz and above. The only way for this to occur is for a constant pressure from within the enclosure to maintain the proper DD3 velocity as frequency changes. This process does not change the specifics of a driver 41 sound signature only the effects mass and random internal standing waves have on its' operation. The frequency peak UU, @500 Hz FIG. 12A of FIG. 1 does not exist in the graph FIG. 12C of FIG. 2 nor does the increase at 10 kHz. At point TT@500 Hz FIG. 12C there is a dip and only a small insignificant peak then falling response.

A vibrating body will experience its' greatest motion at resonance with less movement above and below that frequency for the same stimuli. The output (motion) falls much faster below resonance because of compliance while above it falls at a slower rate due to mass. The loss of output above resonance is directly related to mass (as it is affects the acceleration of the DD 3 as needed at higher frequencies) while the DSW in the EATL5 are directly related to frequency and increase pressure to counter the loss and maintain pressure constant (DD 3 in motion). The DSW generated internally at the mouth of the EATL5 provides positive pressure in real time buffered through volume of chamber 10 as each frequency may require in a composite wave maintaining maximum signal transfer relative to atmospheric pressure. The random standing waves existing in the enclosure of FIG. 2 disturb the dispersion pattern by producing random pressures on various parts of the DD3 to generate noisy sound. [Loudspeaker driver engineers in determining parameters for their products cannot predict the effects of field usage. Specifications developed to predict the vibration characteristics and dispersion of any given driver diameter are not useful if the enclosures SW are allowed to affect the DD 3 radiation pattern. This is one of the main reasons that engineers seek various types of suspension 27 and DD 3 materials as a solution to resist DD 3 breakup caused by these unknown sources. These breakup patterns are caused by random standing waves, which are dynamic and linked to the enclosure 1, amplifying source and signal. Random standing waves must be transformed into beneficial ones not resisted as in existing enclosure design if a neutral expression of a driver is to be observed. The elimination of random internal standing waves and the production of useful coherent ones allow the driver 41 to operate as specifications describe for the materials, diameter and construction.] A further result of this acoustically derived internal positive pressure is to further reduce diaphragm breakup as the pressure is applied to the entire surface to reduce the effects of solid transfer breakup modes. These are breakup modes that are generated when the voice coil 28 is stimulated. Initial stimulation at 28 results in DD3 motions, flexing of all materials and a physical transfer of acoustical-mechanical energy towards the edges of the DD 3 as waves. At the outer edges of the DD 3 exist some type of flexible material 27 that surrounds and anchors the diaphragm to allow general motion of the entire moving assembly when the voice coil 28 stimulates it. It is desired to have the energy that travels these paths dissipate in the diaphragm material and as kinetic energy into the surround material 27 and that does occur in most cases. The diaphragm and surround material 27 do not absorb all frequencies and some are reflected back toward the center or point of origin. In doing so waves, coherent and non-coherent, physically collide in the DD 3 material causing regions of positive and negative standing waves to exist on the DD3 surface that alter the dispersion pattern. These types of patterns can be observed and countered during engineering design phases and perhaps will result in a better driver 41. The EATL5 will minimize audibility of these types of breakup modes but not eliminate them.

Figure 4:
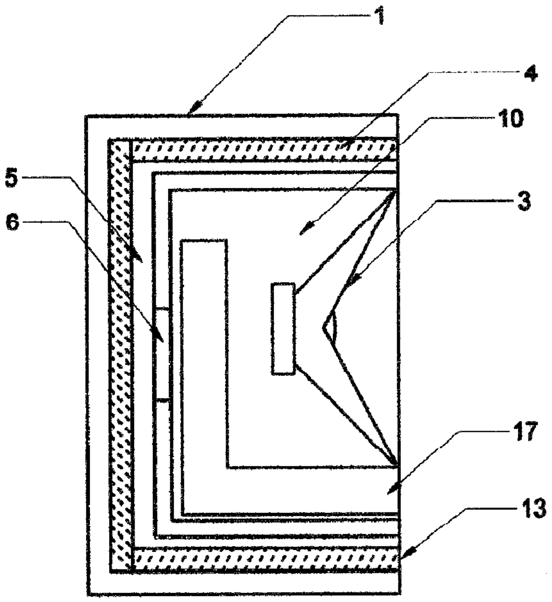
FIG. 4A and FIG. 4B is a cross section front and side view of the IDC EATL of FIG. 3 in accordance with this invention with a reflex port added to the enclosure.
Figure 4:
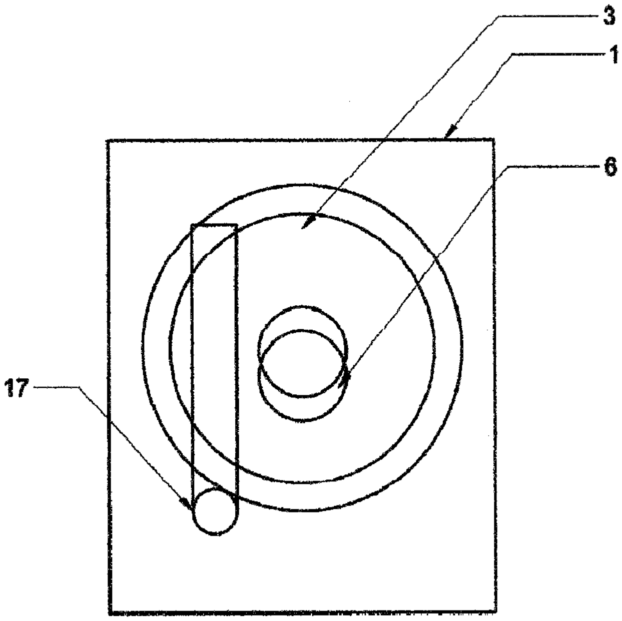
Figure 10:
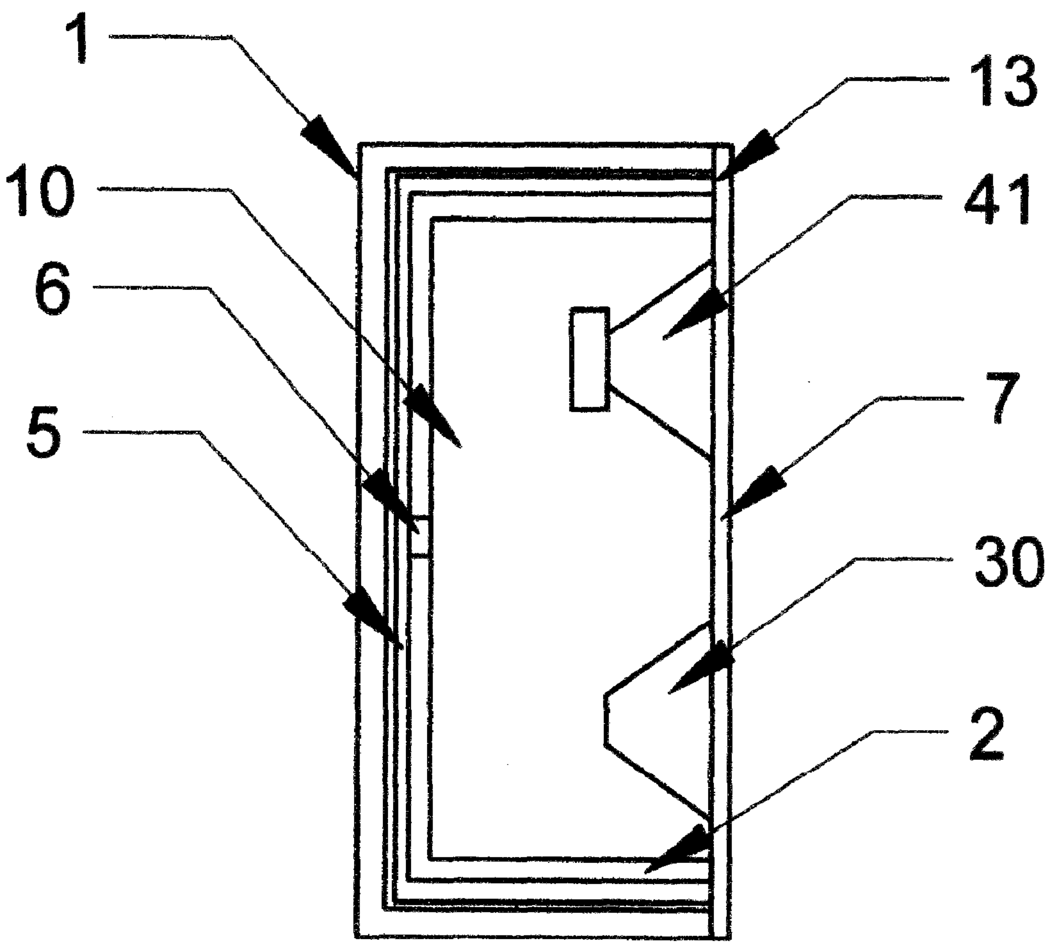
FIG. 10 is a simple illustration of side cross-sectional view of a preferred embodiment of the speaker system of FIG. 1 wherein the port has been replaced with a passive radiator mounted on the baffle board with the driver. This drawing shows the references to those parts pertinent to this mode of operation.
Figure 11:
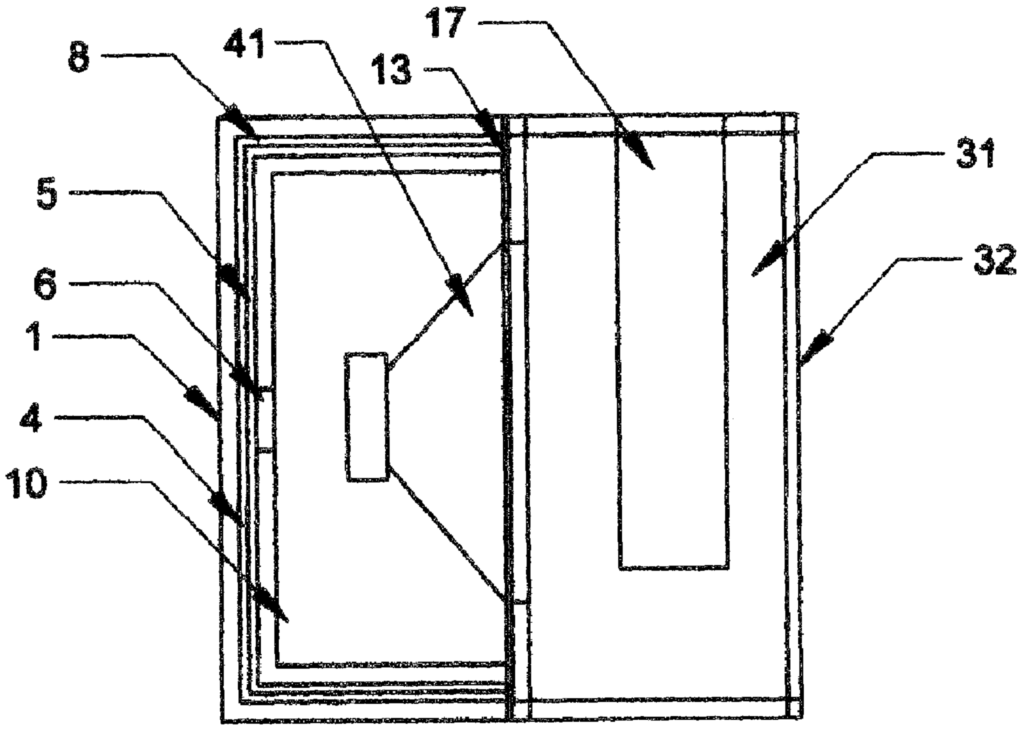
FIG. 11 is a simple illustration of a band-pass mode of operation of the system of FIG. 1 showing an acoustic low pass filter coupled to the front of the driver using a port to radiate the sound. References are made to portions material to this mode of operation.

The Drawing of FIG. 4 represents the enclosure of FIG. 1 or FIG. 3 with the inclusion of a port 17 to enhance bass frequencies. The addition of a port 17 does not affect the DSW at the throat/mouth 6 and the maintenance of acceleration of higher frequencies by the EATL5 whose primary purpose in this embodiment is to counter the mass that results in signal loss above the resonance frequency of the driver 41. The EATL5 provides critical damping for the DD3 to improve stability at lower frequencies as indicated in FIG. 12B of FIG. 1 and FIG. 12D of FIG. 2. These impedance plots indicate that the resonance frequency remains near the same for both enclosures however the peak A of FIG. 12B indicates proper damping of the DD3 [as a controlled peak ratio is achieved for a smooth extended bass response and character] whereas the impedance plot of FIG. 12D indicates that the driver 41 has a high sharp resonance peak C [to indicate a sharp loose resonate sound]. This highly damped condition is maintained in FIG. 13B of FIG. 4 with a port 17 included to extend the response of bass. The impedance plot FIG. 13B has three distinguished peaks with the port peak F and saddle G (box resonance frequency) before the driver resonance peak H indicating reflex operation is occurring with a well-damped driver 41 that is simultaneously having its' upper frequencies lifted beginning at 400 Hz. When compared with the driver in FIG. 2 with the impedance curve FIG. 12D the driver 41 of FIG. 4 has three peaks FIG. 13B indicating an increase in output both above and below the driver resonance peak H due to controlled resonance In observing the frequency location of the peak I caused by the EATL5 positive pressures it can clearly be seen that the ported enclosure of FIG. 4 is the 9 mm enclosure discussed earlier with a 400 Hz peak position on the graph. This peak H and EATL5 peak I of impedance curve FIG. 12 at 400 Hz remained in the same position indicating a well loaded speaker system that has enhanced (properly damped and extended) lower frequencies and (properly accelerated) upper frequencies. Shown in FIG. 10 is a simple illustration using a suitable passive radiator 30 substituted for the port to work in conjunction with the driver 41 to extended the bass to lower frequencies. The use of a passive radiator 30 would maintain the sealed condition of the acoustic system however all configurations would not benefit from this type of resonate system. Passive radiators 30 generally require more mounting area and would be suitable for larger systems with more available baffle board 7 area. The passive radiator 30 EATL5 configuration would maintain the same general characteristics as the ported system if it is aligned properly and have a curve similar to that of FIG. 13B. Another alignment for the DRE29I is that of coupling the front of the driver 41 to an acoustic low pass filter as in FIG. 11. A port 17 or passive radiator 30 is capable of acting as an acoustic low pass filter in conjunction with air mass 31. Here the EATL5 provides for constant pressure loading, damping and enhanced upper bass output and control while the port 17 establishes box loading with air volume 31 reducing DD 3 excursion allowing for a sealed air chamber 10 and better damping. The design will have three impedance peaks as that of the other ported EATL 5 designs one ahead and behind the DRF. Again as in the earlier example a passive radiator 30 can exist to resonate the new air mass 31 existing in front of the driver 41 when mounted in at least one wall of the additional enclosure 32. The IDC EATL5 acts as an ideal impedance matching device for virtually any conventional type of driver and loading method. It creates two ranges of increased pressure to benefit the frequencies above and below a drivers' resonance. Frequencies above resonance can be directly radiated as for the full range or the DD3 can be loaded into an acoustic low pass filter to focus on a range of bass frequencies.

Any driver will have an optimum frequency range of operation that it is most suited to reproduce. It would be very difficult if not impossible to obtain perfect operation for one driver 41 over the range of 20 Hz to 20,000 Hz especially at higher power levels. Individual EATL5 optimized enclosures DRE 29 can focus their advantages on narrow sound ranges to assist the driver in its optimal range.

This may be for the purpose of dividing the sound ranges to use optimal drivers for each range FIG. 10A 29H, 29M, 29L, 29VL using individually optimized EATL5 enclosures or it may be for the purpose of increasing the sound level in a single range FIG. 10B 29A, 29B, 29C, 29D using multiple EATL5 enclosures operating in the same frequency range or for both applications simultaneously. These types of operation are enhanced because of the positive pressure behind each driver and the resistance therefore from interfering with each other" diaphragm. Conventional close spacing of drivers' results in many unpredictable effects because the random nature of the individual internal standing waves further alters the dispersion pattern. The Coherent output of EATL 5 enclosures will combine in multi-way speakers to make the crossover from one driver to another smoother and more lobe free. The coherent output from grouped reinforcement drivers whether cluster or line will perform according to their intended theory. A special housing 16 can be used to adjust the DRE 29 units properly for the application.

Figure 7:
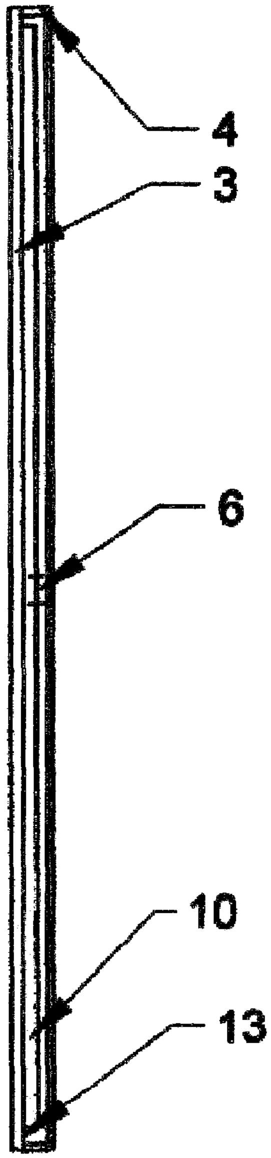
FIG. 7 is a simple drawing highlighting features necessary to illustrate the use of the EATL technology with planar speakers.
Figure 9:
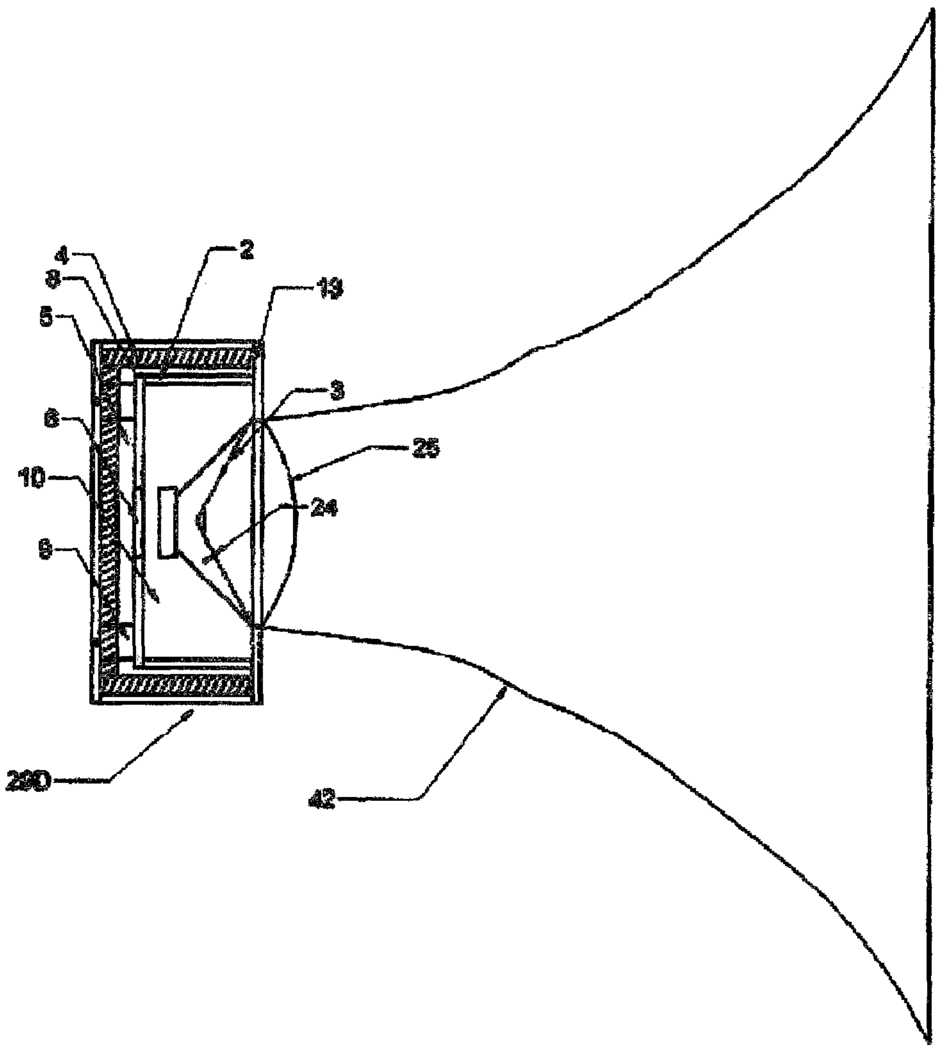
FIG. 9 is a simple drawing highlighting features necessary to illustrate the use of the EATL technology with horn coupling devices.

The EATL5 can also be used in conjunction with exotic acoustic transducers (driver 41) such as with electrostatic and dynamic planar type diaphragms. Typically the flat panel loudspeakers radiate bi-directionally because of the negative effect an enclosure or close wall placement has to one side of the sensitive diaphragm. The random reflected standing waves are of even greater harm because of the large diaphragm surface area required to generate meaningful sound levels with these types. FIG. 7 is a simple illustration indicating the important reference parts for EATL5 use with these flat panel type loudspeakers. The EATL5 would consist of the same basic parts as illustrated as the dynamic driver 41 version only larger panels would be involved and adjustments of certain other parameters involved with EATL5 construction. Certain types of exotic drivers qualify and can only benefit from IDC of the EATL5 and this is the case for the planar speaker DD3. Illustrated in FIG. 9 is the use of a horn apparatus to IDC the EATL5 for further transmission benefit. Horns are generally used to increase the level, distance and some times coverage in a specific area while shadowing others. The close coupling of the horn extension to the unaided DD 3 of the horn produces intense reflections back into the DD 3. Typically a horn coupled driver 41 suffers chronically from breakup because these reflected features are acoustically amplified so the DD 3 suffers from competing horn bell type reflections at its' surface. A phase plug 25 may be necessary to maximize pressure transfer depending on the diaphragm type. The driver 41 operating with the positive pressure of the EATL5 assisted environment will not be as affected by these reflections producing a much clearer output from a well designed horn coupling.

DIRECT COUPLED LOW FREQUENCY ONLY APPLICATIONS-Conventional loudspeakers need large diaphragm areas and/or high mass to produce low frequencies while attaining high efficiency in the process. The current processes for bass reproduction are inherently efficient because they operate the driver at and near its' resonant frequency but this is also the Achilles' heel for sound quality. Resonance is the number one enemy of a finished sound system although the parameter is involved with the execution of any speaker system. The DC EATL 5 mode of operation will allow a very small driver to produce low bass frequencies at low to moderate efficiencies. When a 3" driver is made capable of producing very low frequencies at a useful level then efficiency isn't a proper term to characterize its' performance.

Figure 5:
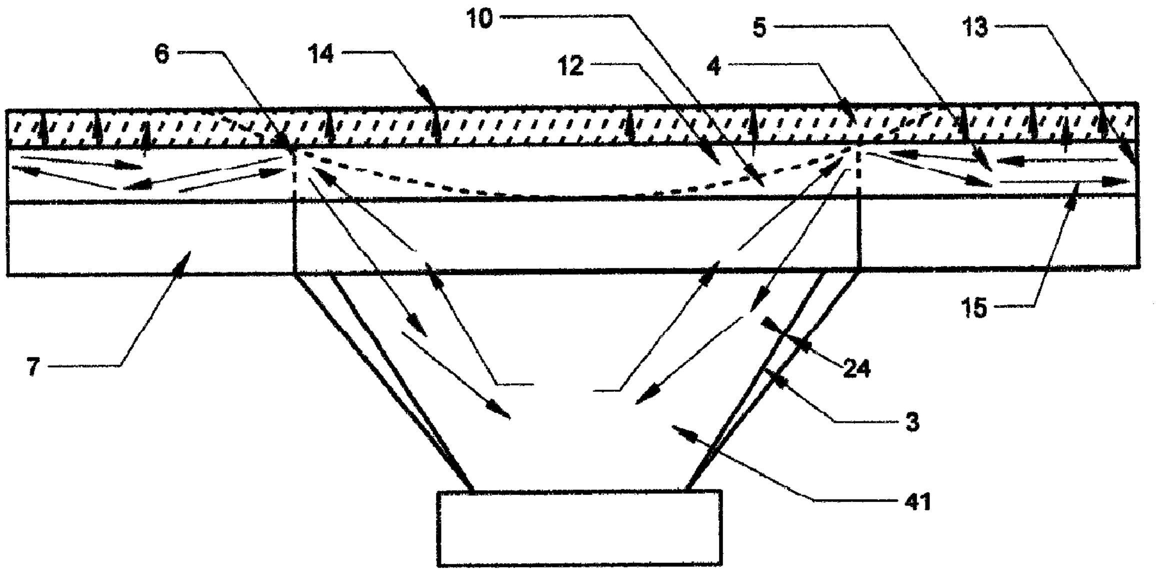
FIG. 5 is a cross section view of a preferred embodiment of the Direct Coupled (DC) EATL in accordance with this invention.

FIG. 5 represents the application of the EATL5 in conjunction with a dynamic driver 41 for the purpose of generating very low frequencies only and is called the Direct Coupled DC EATL 5. The EATL construction is very similar to the IDC with the exception of a larger throat/mouth opening 6 equal to the driver diameter and compression plug 12 located immediately in front of the driver 41. The EATL 5 is Directly Coupled (DC) to the driver 41 with minimum area air volume in chamber 10 between the driver and the throat/mouth 6 of the EATL 5. The driver is mounted with front facing the EATL5 mouth 6 so as to create a high compression chamber 10 for driver loading. In this mode the driver 41 is compression loaded so a compression plug 12 is used to help direct wave motion into the EATL 5 and to minimize air turbulence at the throat/mouth 6 of the EATL5 and to establish the correct throat/mouth 6 area for the EATL5. DC coupling places the driver 41 completely under the influence of the EATL5 and it will follow the frequency pattern it establishes. The ADTM 4 establishes delay of the waves through depth migration thus allowing a wide DSW bandwidth. The higher low frequencies above driver 41 resonance are not effected as readily by the cellular structure and will sustain constant pressure in the EATL 5 before depth migration. This can be seen in FIGS. 13C and 14D.

Figure 13C:
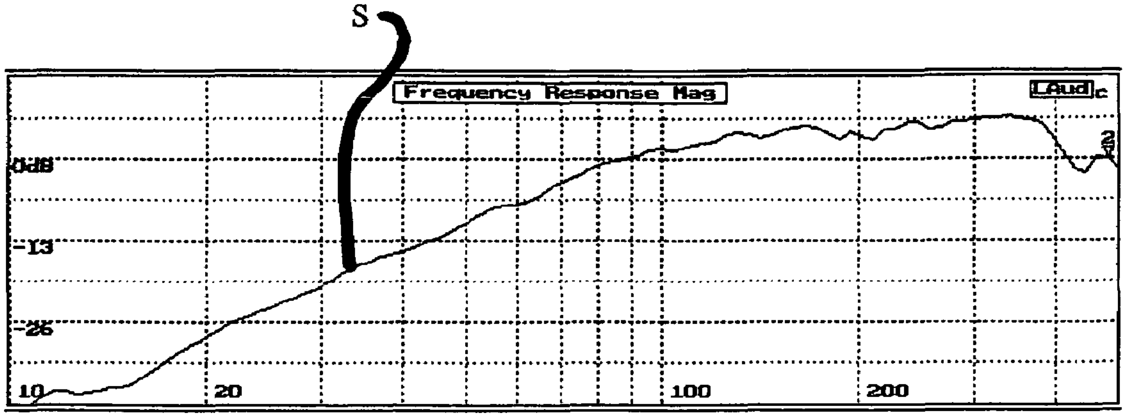
Figure 13D:
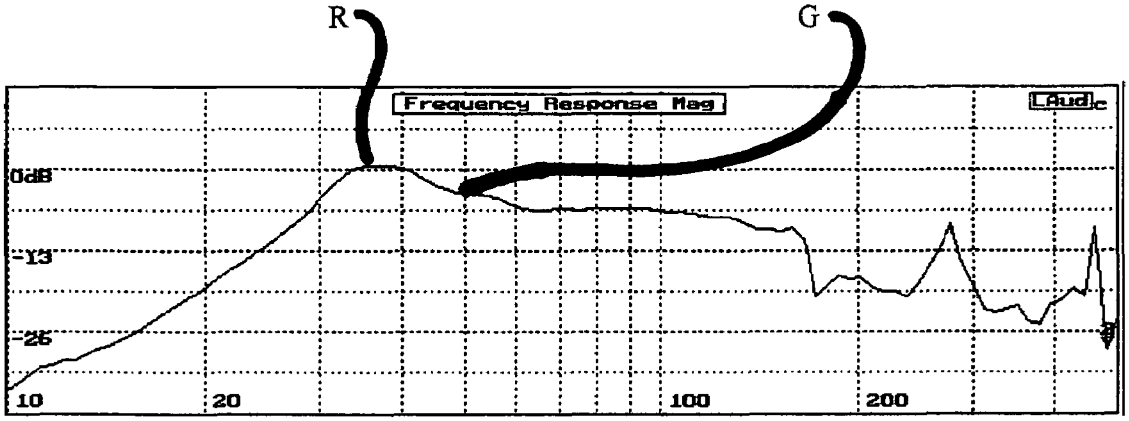
Figure 14A:
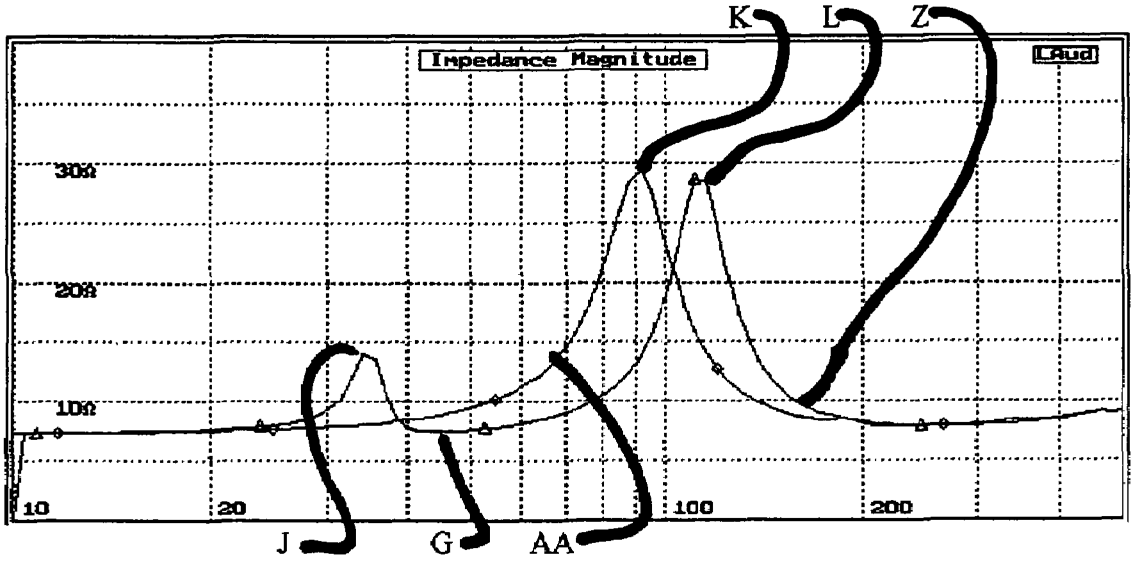
FIG. 14A, FIG. 14B, FIG. 14C, FIG. 14D, FIG. 14E are graphical representations of performance claimed in the specification and are indicated by reference designations matching in the text.
Figure 14D:
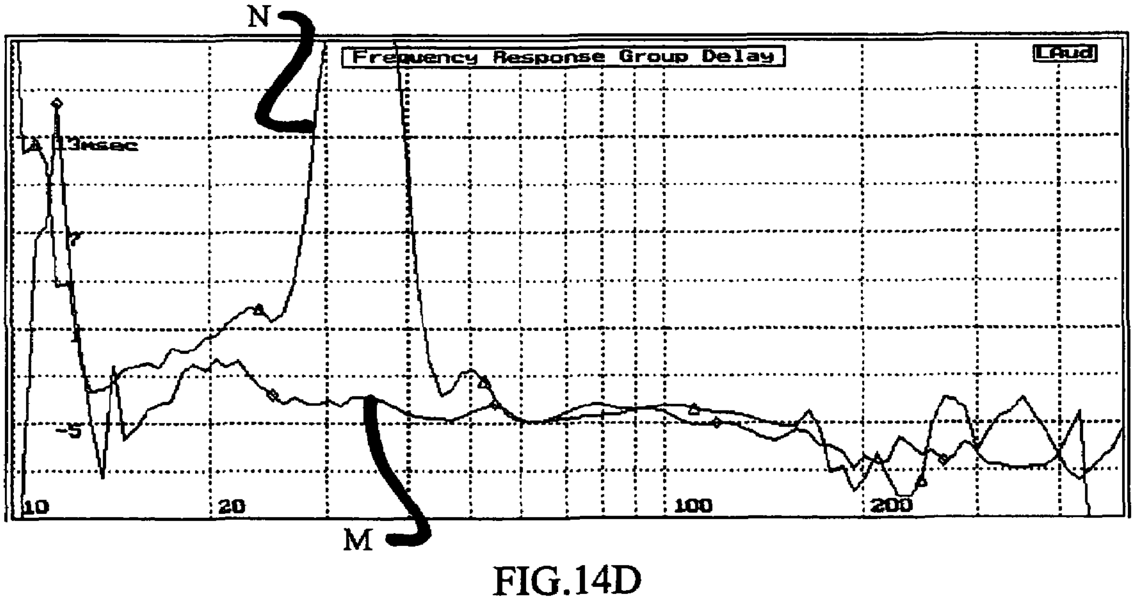

The frequency response curve FIG. 13C represents the driver 41 output of a DC driver and EATL5 only and it can be seen that the frequency response shows a 12 db/oct falling output from the driver 41 resonance frequency and frequency irregularities above driver resonance. This represents a constant high positive pressure on the DD 3 relative to frequency and a dynamic pressure much greater than atmospheric pressure for all frequencies in the systems bandwidth. When measured at 100 Hz this signal at the DD3 is 40 db greater than that at the mouth of the port 17 when it is added. This output curve represents the actual output that the driver 41 will deliver with the positive pressure applied to the DD 3 from the EATL 5. In free air a similar pattern would be generated except the 12 db/oct slope would begin at the drivers' free air resonance frequency. Under these conditions the frequency would shift if the acoustic impedance of the driver is altered. Curve S is a reference high-pressure curve with a predictable 12 db/oct rate of fall and is easy to shape with an acoustic low pass filter. This curve also reflects a predictable falling diaphragm excursion relative to lower frequencies. A reflex enclosure would further reduce DD 3 motion in the power bass frequency range (30 Hz–60 Hz) and not have a subsonic distortion problem after the EATL5 peak. An acoustic low pass filter 18 connected to the driver 41/EATL5 in FIG. 5 would favor the lowest frequencies even though these frequencies are falling in curve S FIG. 13C. The 12 db/oct falling output of FIG. 13C are transformed into the curve R of FIG. 13D for FIG. 6 which shows 6 db/oct rising output from 70 Hz. The curve in FIG. 13C is generated with the driver 41 in high-pressure environment that will resonate the box with little effect on the constant pressure loading of the driver. The positive pressure allows the output from the rear of the driver to resonate a reflex enclosure with acoustic volume 19 at frequencies within the 12 db/oct slope. The efficiency in the range of the transformation is moderate relative to the driver mid-band efficiency yet it allows a small low mass driver to use its' fast responding diaphragm to produce usable bass at frequencies determined by the EATL5. Almost any similar diameter driver 41 used if its compliance is not to stiff will generate the curves of FIG. 13C and FIG. 13D. The ¼ wave positive pressure is a real-time mass component acoustically applied to the DD 3 to produce the enhanced low pass performance from the driver 41 as indicated in FIG. 13D for FIG. 6. The drivers' 41 mass and other parameters will affect distortion, efficiency and to some degree extreme frequency cut-off so optimum performance from a certain EATL/Reflex enclosure can be had through driver 41 choice. The efficiency of this type of bass system is still related to actual DD 3 area and it increases with a larger driver 41 as would be normal since more air molecules would be moved. Typically the low frequency output of large drivers 41 increase relative to mid-band output because of diaphragm area as mass deters output at higher frequencies. The DCEATL 5 low frequency system develops output from diaphragm area not geometry. The listening room, typically being an acoustic space with dimensional gain, also favors lower frequencies if they are present. The curve of FIG. 14C represents distant microphone placement when measuring the sub-bass system of FIG. 6. The room acts similar to the reflex enclosure in lifting the output at the lower bass frequencies as is seen in curve O by the big increase in gain in the 15 Hz octave in FIG. 14C relative to adjacent frequencies. FIG. 14A indicates the impedance of FIG. 5 and FIG. 6. The curves are overlaid to show how little the reflex box alters the resonant frequency and Q of the driver when it is connected. This indicates that the positive pressure within the EATL 5 dominates the drivers' impedance with little effect on the driver 41/EATL 5 operating parameters from the addition of the acoustic low pass filter. In FIG. 14A the large peak K represents the impedance of the driver in FIG. 5. The small peak J trailing the driver peak L in FIG. 14A would be considered the ports peak with a conventional reflex enclosure and the output would fall off rapidly as the frequency approaches this peak. This peak represents the same EATL 5 peak that was observed in the impedance peak of FIG. 12B, FIG. 13A, FIG. 13B except that it has been pushed below the driver resonance due to the close coupling of the EATL5. It has been shown that increasing the length of the EATL5 will lower the EATL5 peak, as close coupling will also cause. Depth migration is greater under high pressure causing the ¼ wave signal to appear at the driver diaphragm below box tuning. It is also observed as shown in FIG. 13D that the output will fall after the main EATL 5 peak but the close coupling will load the driver to the EATL5 cut-off frequency of near 15 Hz. If it is observed carefully the output curve R of FIG. 13D of the sub-bass enclosure FIG. 6 has its' highest output at the EATL 5 peak of 35 Hz which is an extraordinary feature. The reason for this can be seen if the curves of FIG. 14D are observed. FIG. 14D represents the phase curves of the subwoofer in FIG. 6. The curves are overlaid to show their relationships. Curve M represents the microphone placement very close to the driver diaphragm at its' surface boundary area 24 where it will show the curve of the EATL5. Curve N is indicating the output at the port 17 of the same sub-bass speaker of FIG. 6 and it can clearly be seen a large shift in phase beginning at 55 Hz which is near the box tuning frequency. The outputs of the DD 3 and the port 17 are remarkably similar until the phase begins to shift at the box frequency G of FIG. 14A producing the initial rise in output as seen in curve R FIG. 13D at G. The phase curve M FIG. 14D of the driver indicates a reverse change beginning at near the same point 55 Hz with a small depression indicated throughout the remainder of the phase curve at the driver. This depression represents the high pressure being applied to the diaphragm to produce the phase change at the port and the corresponding increase in output. This pressure is applied at the time when the DD3 is under box loading for maximum effectiveness. The pressure on the diaphragm remains constant as viewed by the flat phase curve to 55 Hz and doesn't change even when the EATL Speak further loads the diaphragm to cause the increased output. The result of the EATL5 feedback and the box loading establishes an effective acoustic low pass system that will allow any practical driver diameter to produce very low frequencies at efficiencies relative to the driver diameter even if the resonance frequency is much higher.

Horn loading of the driver for low frequency reproduction while in the DC compression mode of operation can be effective if physical space isn't a real consideration. The well-loaded driver 41 is a good candidate for horn coupling to the ambient but large surface expansion areas are required to support launching of the long waves. In some cases embedded applications in buildings or large structures will allow portions of the structure to act as horn wave-guides. In some cases folding of the required waveguides will allow implementation of a low frequency horn even an enclosure version.

Figure 8:
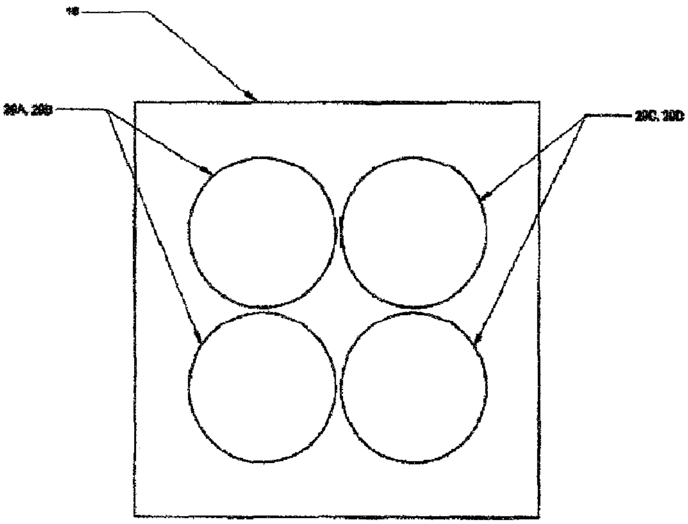
FIG. 8A is a simple drawing highlighting features necessary to illustrate a multi-way frequency divided IDC EATL system.
FIG. 8B is a simple drawing highlighting the features necessary to illustrate a cluster of DRE or IRE EATL enclosures to increase SPL in a single range.
Figure 8:
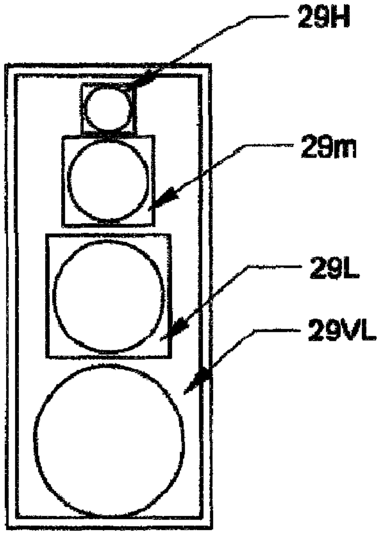

Of course as with the EATL5 DRE29D enclosures multiple units of the IRE29I may be configured to increase the output as a combined coherent source as in FIG. 8A the sound will more approach the theoretical 6 db per doubling of units. This and the excellent immunity to the rooms' reflections will maintain the integrity of the source. The IRE 29I may also be combined as in FIG. 8B to have the EATL 5 peak to occur in different ranges to maximize the output in each range. This will allow for maximum low frequency output over a wider range.

Figure 6:
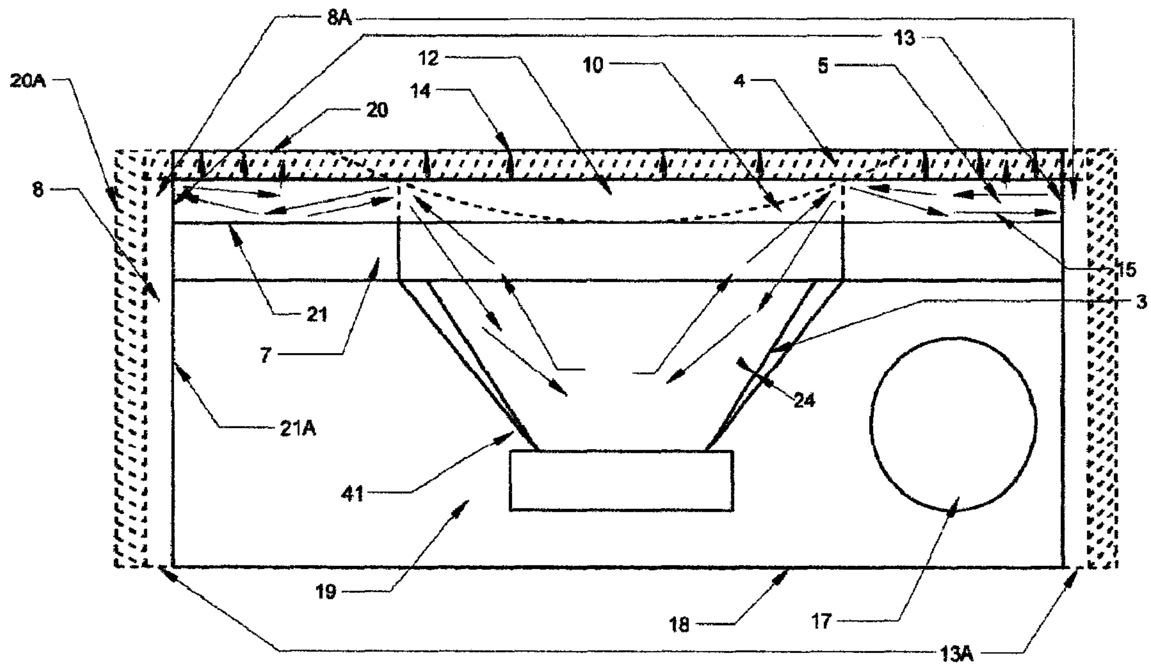
FIG. 6 is a cross section view of a preferred embodiment of the DC EATL physically combined with a standard non-damped bass reflex enclosure.
Figure 14B:
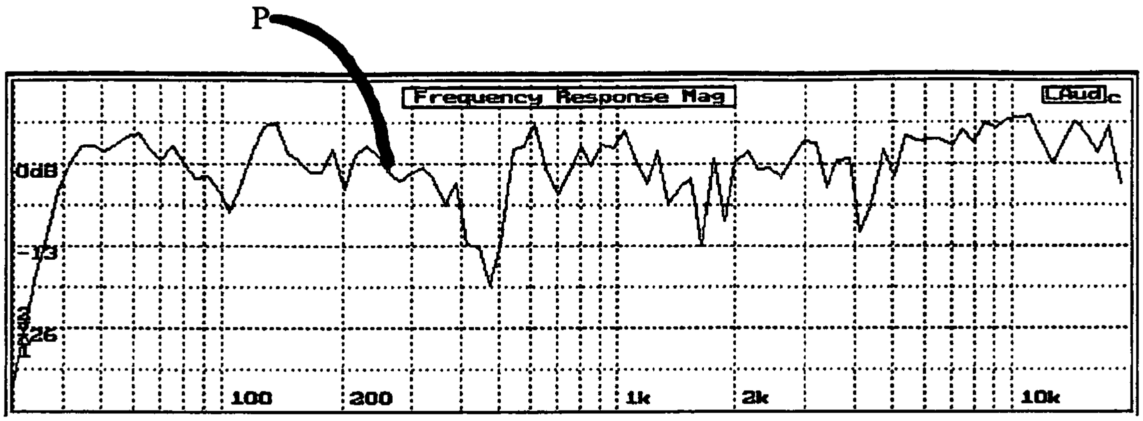
Figure 14E:
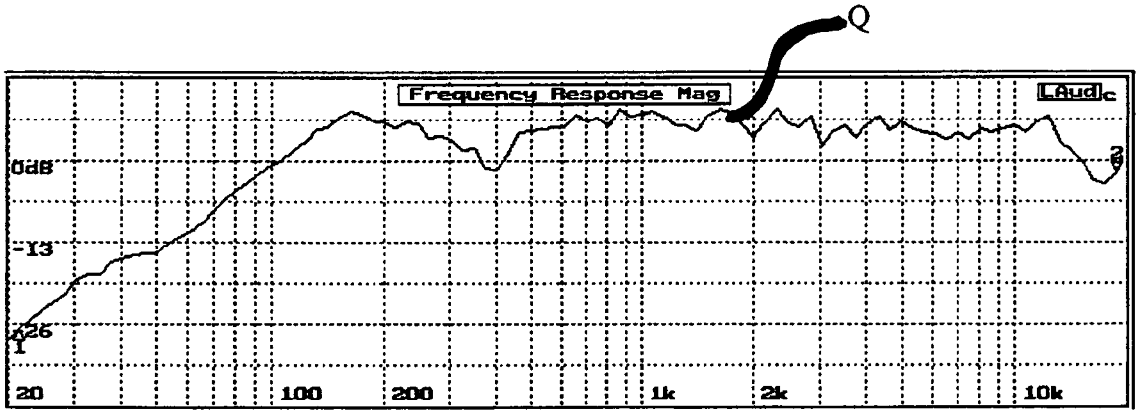
Figure 14C:
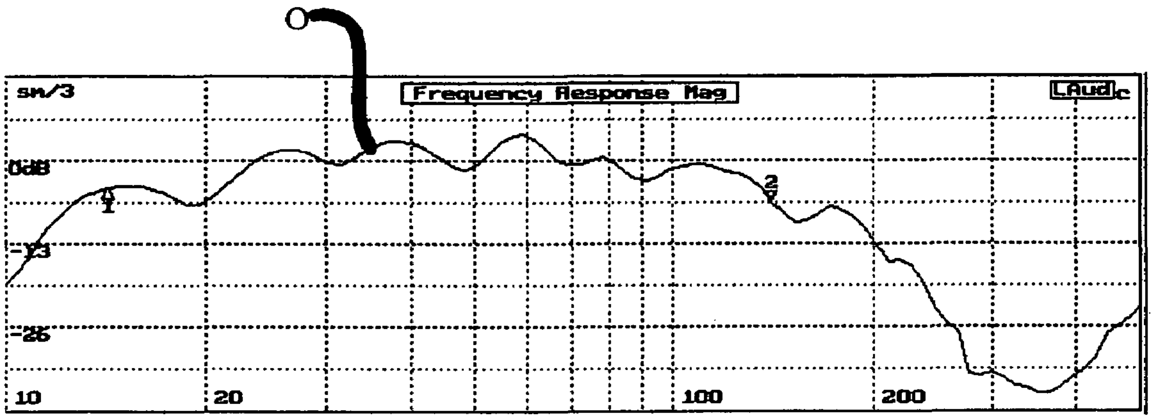

An preferred example of an extreme application of the IDC and DC systems used concurrently for a single sound system is illustrated by the graph of FIG. 14B. The curve in FIG. 14B represents coverage of the audio range from below 35 Hz to 20 kHz using 3 identical 3-inch diameter drivers operating in almost identically sized miniature (<0.06 cu. ft.) DRE and IRE enclosures as depicted in FIG. 1 and FIG. 6. They are the left speaker FIG. 1, the right speaker FIG. 1 and the subwoofer FIG. 6 that reproduces the lower bass from both channels. The 3-inch driver 41 as in FIG. 1 is the only candidate for a system of this type because it retains the dispersion properties required of a tweeter or high frequency driver but has enough diaphragm area making it capable of having its' impedance matched by both the DC or IDC coupled EATL5 to cover the entire frequency range. The free-air resonance of the driver is 100 Hz normally much to high for subwoofer operation yet the DC EATL/Reflexenclosure 29D covers the range from below 35 Hz to 125 Hz where it mates with an IDCEATLenclosure 29I, which covers the range from 125 Hz to 20 kHz. The DC EATL/Reflexlow frequency system has its' upper frequency range adjusted electronically and is powered by a separate amplifier so that it can be set to properly blend with the IDC EATLenclosure 29I in any field environment. This system achieves near perfect vertical and horizontal off-axis response and requires no additional parts within the enclosures. The system output illustrated in FIG. 14B is capable of achieving in excess of 90 db output at the listening position in an average size room for the indicated frequency range. This system including 2 speakers, subwoofer, amplifier, tripod stands and all connecting accessories fits neatly in a standard executive sized briefcase and exists today.

Most of this document has been involving the validation of the effectiveness of a very simple process. Only a few drawings are needed to express this basic technology that improves the quality of sound so effectively. There will be many ways to use the general principles of this technology because of the generic nature of the improvements involved. For example one may develop a new product with a different shape or discover new ways to couple the EATL5 to the atmospheric pressure including in some ways the basic principles of the EATL 5. Any use of the principles discussed within this document is an infringement even if these changes or modifications are not expressed explicitly here. Once a person skilled in the art realizes the immediacy of the problem sees the drawings and experiences the sonic differences it will be very easy to duplicate and enhance the process without understanding the theory to a great degree. Any devices deriving their basic purpose for the same reasons that the EATL 5 derives its' purpose are in violation of this technology if the same basic elements coupling the driver 41 for the same purpose are physically connected to the enclosure in the same manner. This means that relocating certain features to various locations will not allow a violation to be overcome as all research on the depth of features and implementation has not been investigated and will be a continuing effort of the inventor.

What is claimed is:

1. An apparatus for improving the acoustic impedance for a loudspeaker comprising:

a first enclosure with six walls connected to define a first box structure, surfaces of three of the walls being a first wave-guide;

a second enclosure disposed within said first enclosure, the second enclosure having at least three walls attached to a front wall of the first enclosure to define a second box structure with an enclosed compartment between the first box structure and the seconded box structure, surfaces of three of the walls of the second enclosure being a second wave-guide;

a termination member affixed at ends of the first and second wave-guides having a surface being a third wave-guide;

an aperture located in a wall of the second enclosure detaining a single opening into the enclosed compartment;

an alternative density transmission medium covering a majority of at least one of said wave-guides;

at least one opening in the front wall common to the first enclosure and the second enclosure, hereinafter called a baffle board, to mount a bi-directional loudspeaker; and a bi-directional loudspeaker mounted on the baffle board;

wherein:

the first, second and third wave-guide comprise an embedded acoustic transmission line; and the interaction of a sound wave with the alternative density transmission medium improves the acoustic impedance of the apparatus.

2. Apparatus, as claimed in claim 1 wherein said interior enclosure is equipped with tuning means to accentuate the low frequencies of the speaker, comprising:

a port means extending through said baffle board.

3. Apparatus, as claimed in claim 1 wherein an acoustic low pass filter is connected in front of the loudspeaker to produce low frequencies only, comprising:

a second enclosure placed in front of said loudspeaker to provide air mass for acoustic low pass function;

a tubular or shelf port means to launch a particular range of low frequencies from said air mass.

4. Apparatus, as claimed in claim 1 further comprising:

a horn type expansion diaphragm means coupled to the loudspeaker in front of the embedded acoustic transmission line to increase throw or coverage.

5. Apparatus, as claimed in claim 1 wherein said loudspeaker is of the planar type of flat panel driver that produces sound waves bi-directionally, comprising:

an electrostatic type sound panel for any frequency range.

6. Apparatus, as claimed in claim 1 wherein said loudspeaker is front mounted directly over and facing said aperture and sealing said embedded acoustic transmission line with said loudspeaker, comprising:

a first and second wave-guide disposed directly in front of and around said loudspeaker mounted at right angles with said center aperture in said second wave-guide and in a radial relationship with said second wave-guide so as to create a channel expanding from the center in a radial manner;

a termination member disposed at the opposite end of the pair of wave-guides disposed to block a wave in the embedded acoustic transmission line to cause a reversal of said wave;

an alternate density transmission medium affixed to at least one wall of one of said wave-guides; and a driver of the loudspeaker mounted at said mouth of said embedded acoustic transmission line.

7. Apparatus, as claimed in claim 6, further comprising:

a compression plug mounted directly in front of said driver to guide said wave and increase pressure on said driver to maintain a pressure differential with atmosphere.

8. Apparatus, as claimed in claim 6 wherein the reverse side of the driver is coupled to a acoustic low pass filter to produce low frequencies only;

the acoustic low pass filter comprising an enclosure and a port tube.

9. Apparatus, as claimed in claim 6 wherein the acoustic embedded transmission line comprises multiple embedded acoustic transmission lines each for a different frequency range to optimize the operation in each range while independent or housed in a common larger enclosure used for the lowest frequencies; and further comprising multiple dynamic transducers each of a different diameter appropriate for that frequency range.

10. Apparatus, as claimed in claim 6 wherein the alternate density transmission medium includes open cell urethane foam.

11. The apparatus of claim 1, further comprising:

a port means extending from an interior cabinet through a wall of the enclosure.

12. The apparatus of claim 1, further comprising:

a passive diaphragm mounted on the baffle board.

13. The apparatus of claim 1, further comprising:

an acoustic low pass filter attached to the reverse side of the driver to produce low frequencies.

14. A speaker system, comprising:

a first cabinet a second cabinet having a common front wall with the first cabinet and have at least three wall attached to walls of the first cabinet to define an enclosed compartment between the first cabinet and the second cabinet, the enclosed compartment having no vent or port to the external environment;

an aperture between the first cabinet and the second cabinet; and an alternative density transmission medium in the enclosed compartment and attached to a wall of the second cabinet or the first cabinet;

wherein a sound wave passes through the aperture into the enclosed compartment, interacts with the alterative density transmission medium and is reflected back through the aperture to improve the acoustic impedance of the speaker system.

15. The speaker system of claim 14, further comprising:

a bi-directional loudspeaker mounted to the common front wall.

16. The speaker system of claim 14, wherein the alternative density transmission medium includes open cell foam.

17. The apparatus of claim 1, wherein one of the walls of the first enclosure comprises a flat back wall.

18. The apparatus of claim 14, a wall of the first cabinet comprises a flat back wall with a planar surface.

* * * * *